(12) United States Patent
Wood et al.

(10) Patent No.: US 6,753,248 B1
(45) Date of Patent: Jun. 22, 2004

(54) POST METAL BARRIER/ADHESION FILM

(75) Inventors: Michael Wood, San Jose, CA (US);
Barry L. Chin, Saratoga, CA (US);
Paul F. Smith, San Jose, CA (US);
Robin Cheung, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/352,505

(22) Filed: Jan. 27, 2003

(51) Int. Cl.[7] .......................................... H01L 21/4763
(52) U.S. Cl. ...................... 438/627; 438/669; 438/675
(58) Field of Search .............................. 438/627, 631, 438/634, 639, 669, 675

(56) References Cited

U.S. PATENT DOCUMENTS

| | | | |
|---|---|---|---|
| 4,389,973 A | | 6/1983 | Suntola et al. ............... 118/725 |
| 4,413,022 A | | 11/1983 | Suntola et al. ............ 427/255.2 |
| 4,961,822 A | * | 10/1990 | Liao et al. |
| 5,196,365 A | | 3/1993 | Gotou ............................ 437/52 |
| 5,923,056 A | | 7/1999 | Lee et al. ..................... 257/192 |
| 6,015,917 A | | 1/2000 | Bhandari et al. ............... 556/12 |
| 6,084,302 A | | 7/2000 | Sandhu ........................ 257/751 |
| 6,125,158 A | | 9/2000 | Carson et al. ............... 375/376 |
| 6,144,060 A | | 11/2000 | Park et al. ................... 257/310 |
| 6,174,809 B1 | | 1/2001 | Kang et al. .................. 438/682 |
| 6,174,811 B1 | * | 1/2001 | Ding et al. |
| 6,197,683 B1 | | 3/2001 | Kang et al. .................. 438/643 |
| 6,200,893 B1 | | 3/2001 | Sneh ........................... 438/685 |
| 6,203,613 B1 | | 3/2001 | Gates et al. .................. 117/104 |
| 6,207,487 B1 | | 3/2001 | Kim et al. .................... 438/238 |
| 6,270,572 B1 | | 8/2001 | Kim et al. ...................... 117/93 |
| 6,284,591 B1 | * | 9/2001 | Lee |
| 6,284,646 B1 | | 9/2001 | Leem .......................... 438/629 |
| 6,287,965 B1 | | 9/2001 | Kang et al. .................. 438/648 |
| 6,305,314 B1 | | 10/2001 | Sneh et al. ............. 118/723 R |
| 6,319,616 B1 | | 11/2001 | Lopatin et al. .............. 428/469 |
| 6,342,277 B1 | | 1/2002 | Sherman ...................... 427/562 |
| 6,348,376 B2 | | 2/2002 | Lim et al. .................... 438/253 |

(List continued on next page.)

FOREIGN PATENT DOCUMENTS

| | | | |
|---|---|---|---|
| EP | 1167569 | 1/2002 | ......... C23C/16/455 |
| GB | 2355727 | 5/2001 | ........... C23C/16/44 |
| JP | 2001-172767 | 6/2001 | ........... C23C/16/40 |
| JP | 2001-111000 | 12/2002 | ........... H01L/21/02 |
| WO | 99/29924 | 6/1999 | ........... C23C/16/04 |
| WO | 99/65064 | 12/1999 | ........... H01L/21/00 |
| WO | 00/16377 | 3/2000 | |

(List continued on next page.)

OTHER PUBLICATIONS

Kukli, et al., "Tailoring the Dielectric Properties of $HfO_2$–$Ta_2$–$O_5$ Nanolaminates," Applied Physics Letters, vol. 68, No. 26, Jun. 24, 1996; p. 3737–9.

Kukli, et al, "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670–5.

Kukli, et al., "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236–42.

(List continued on next page.)

*Primary Examiner*—Phuc T. Dang
(74) *Attorney, Agent, or Firm*—Moser, Patterson & Sheridan, LLP

(57) ABSTRACT

A method for processing a substrate. The method generally includes forming a copper interconnect in a sacrificial layer deposited on the substrate by patterning the sacrificial layer to form an interconnect and filling the interconnect with copper. The method additionally includes removing at least a portion of the sacrificial layer upon copper interconnect formation, depositing a barrier layer on the copper interconnect, and depositing a dielectric layer on the barrier layer.

21 Claims, 3 Drawing Sheets

U.S. PATENT DOCUMENTS

| | | | |
|---|---|---|---|
| 6,358,829 B2 | 3/2002 | Yoon et al. | 438/597 |
| 6,372,598 B2 | 4/2002 | Kang et al. | 438/597 |
| 6,379,748 B1 | 4/2002 | Bhandari et al. | 427/255.394 |
| 6,391,785 B1 | 5/2002 | Satta et al. | 438/704 |
| 6,399,491 B2 | 6/2002 | Jeon et al. | 438/680 |
| 6,416,577 B1 | 7/2002 | Suntoloa et al. | 117/88 |
| 6,451,119 B2 | 9/2002 | Sneh et al. | 118/715 |
| 6,451,695 B2 | 9/2002 | Sneh | 438/685 |
| 6,455,415 B1 | 9/2002 | Lopatin et al. | 438/628 |
| 6,468,924 B2 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,482,262 B1 | 11/2002 | Elers et al. | 117/84 |
| 6,482,733 B2 | 11/2002 | Raaijmakers et al. | 438/633 |
| 6,500,743 B1 * | 12/2002 | Lopatin et al. | |
| 6,511,539 B1 | 1/2003 | Raaijmakers | 117/102 |
| 6,531,386 B1 * | 3/2003 | Lim et al. | |
| 2001/0000866 A1 | 5/2001 | Sneh et al. | 118/723 R |
| 2001/0002280 A1 | 5/2001 | Sneh | 427/255.28 |
| 2001/0009695 A1 | 7/2001 | Saanila et al. | 427/255.39 |
| 2001/0024387 A1 | 9/2001 | Raaijmakers et al. | 365/200 |
| 2001/0025979 A1 | 10/2001 | Kim et al. | 257/315 |
| 2001/0028924 A1 | 10/2001 | Sherman | 427/255.28 |
| 2001/0034123 A1 | 10/2001 | Jeon et al. | 438/643 |
| 2001/0041250 A1 | 11/2001 | Werkhoven et al. | 428/212 |
| 2001/0054730 A1 | 12/2001 | Kim et al. | 257/301 |
| 2001/0054769 A1 | 12/2001 | Raaijmakers et al. | 257/758 |
| 2002/0000598 A1 | 1/2002 | Kang et al. | 257/301 |
| 2002/0007790 A1 | 1/2002 | Park | 118/715 |
| 2002/0020869 A1 | 2/2002 | Park et al. | 257/306 |
| 2002/0021544 A1 | 2/2002 | Cho et al. | 361/200 |
| 2002/0031618 A1 | 3/2002 | Sherman | 427/569 |
| 2002/0048635 A1 | 4/2002 | Kim et al. | 427/331 |
| 2002/0052097 A1 | 5/2002 | Park | 438/507 |
| 2002/0076507 A1 | 6/2002 | Chiang et al. | 427/569 |
| 2002/0076837 A1 | 6/2002 | Hujanen et al. | 438/3 |
| 2002/0094689 A1 | 7/2002 | Park | 438/694 |
| 2002/0098627 A1 | 7/2002 | Pomarede et al. | 438/149 |
| 2002/0106536 A1 | 8/2002 | Lee et al. | 428/702 |
| 2002/0155722 A1 | 10/2002 | Satta et al. | 438/704 |
| 2002/0162506 A1 | 11/2002 | Sneh et al. | 118/715 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2003/0013320 A1 | 1/2003 | Kim et al. | 438/778 |
| 2003/0031807 A1 | 2/2003 | Elers et al. | 427/569 |
| 2003/0049942 A1 | 3/2003 | Haukka et al. | 438/778 |
| 2003/0072975 A1 | 4/2003 | Shero et al. | 428/704 |
| 2003/0082296 A1 | 5/2003 | Elers et al. | 427/96 |

FOREIGN PATENT DOCUMENTS

| | | | |
|---|---|---|---|
| WO | 00/54320 | 9/2000 | H01L/21/44 |
| WO | 01/15220 | 3/2001 | H01L/21/768 |
| WO | 01/17692 | 3/2001 | B05C/11/00 |
| WO | 01/27346 | 4/2001 | C23C/16/44 |
| WO | 01/27347 | 4/2001 | C23C/16/44 |
| WO | 01/29280 | 4/2001 | C23C/16/32 |
| WO | 01/29891 | 4/2001 | H01L/21/768 |
| WO | 01/29893 | 4/2001 | H01L/21/768 |
| WO | 01/36702 | 5/2001 | C23C/16/00 |
| WO | 01/66832 | 9/2001 | C30B/25/14 |
| WO | 02/08485 | 1/2002 | C23C/16/00 |
| WO | 02/43115 | 5/2002 | |
| WO | 02/45167 | 6/2002 | H01L/27/00 |

OTHER PUBLICATIONS

Kukli, et al., "Properties of $Ta_2O_5$–Based Dielectric Nanolaminates Deposited by Atomic Layer Epitaxy," Journal of the Electrochemical Society, vol. 144, No. 1, Jan. 1997; p. 300–6.

Kukli, et al., "Properties of $(Nb_{1-x}Ta_x)_2O_5$ Solid Solutions and $(Nb_{1-x}Ta_x)_2O_5-ZrO_2$ Nanolaminates Grown by Atomic Layer Epitaxy," 1997; p. 785–93.

Ritala, M., et al., "Chemical Vapor Deposition," Jan. 1999, p. 6–9.

Rossnagel, et al. "Plasma–enhanced Atomic Layer Deposition of Ta and Ti for Interconnect Diffusion Barriers," J. Vac. Sci. Technol. B., vol. 18, No. 4 (Jul. 2000); p. 2016–20.

Niinisto, et al. "Synthesis of Oxide Thin Films and Overlayers by Atomic Layer Epitaxy for Advanced Applications," Materials Science and Engineering B41 (1996) 23–29.

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461), 2001.

\* cited by examiner

US 6,753,248 B1

POST METAL BARRIER/ADHESION FILM

BACKGROUND OF THE INVENTION

1. Field of the Invention

Embodiments of the present invention generally relate to a method for forming a copper interconnect on a substrate.

2. Description of the Related Art

Metallization for sub-quarter micron sized features is a foundational technology for present and future generations of integrated circuit manufacturing processes. In devices such as ultra large scale integration-type devices, i.e., devices having integrated circuits with more than a million logic gates, the multilevel interconnects that lie at the heart of these devices are generally formed by filling high aspect ratio interconnect features with a conductive material, such as copper or aluminum, for example.

One method for forming vertical and horizontal interconnects is by a damascene or dual damascene method. In the damascene method, one or more dielectric materials, such as low k dielectric materials, are deposited and pattern etched to form the vertical interconnects, e.g., vias, and horizontal interconnects, e.g., lines. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material external to the etched pattern, such as on the field of the substrate, is then removed.

However, low k dielectric materials generally have low mechanical strength, making it difficult for the low k dielectric material to withstand further processing, such as planarization by chemical mechanical processing. In addition, damascene processes generally result in structures that exhibit stress and electromigration from the copper interconnect to the low k dielectric. Furthermore, low k dielectric materials are often porous and susceptible to interlayer diffusion of conductive materials, such as copper, which can result in the formation of short-circuits and device failure.

Therefore, there remains a need for an improved process for depositing barrier materials to prevent copper migration into surrounding low k dielectric materials.

SUMMARY OF THE INVENTION

Embodiments of the invention generally include a method for processing a substrate. The method generally includes forming a copper interconnect in a sacrificial layer deposited on the substrate by patterning the sacrificial layer to form an interconnect and filling the interconnect with copper. The method additionally includes removing at least a portion of the sacrificial layer upon copper interconnect formation, depositing a barrier layer on the copper interconnect, and forming a dielectric layer on the substrate after depositing the barrier layer to insulate the copper interconnect.

Embodiments of the invention further include a method for processing multiple layers of a substrate. The method generally includes forming a first copper interconnect in a sacrificial layer deposited on the substrate by patterning the sacrificial layer to form an interconnect and filling the interconnect with copper. The method then includes repeating the steps to form a second copper interconnect, removing the sacrificial layers from the first and second copper interconnect, depositing a barrier layer adjacent the copper interconnects, and depositing a dielectric layer adjacent the barrier layer.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
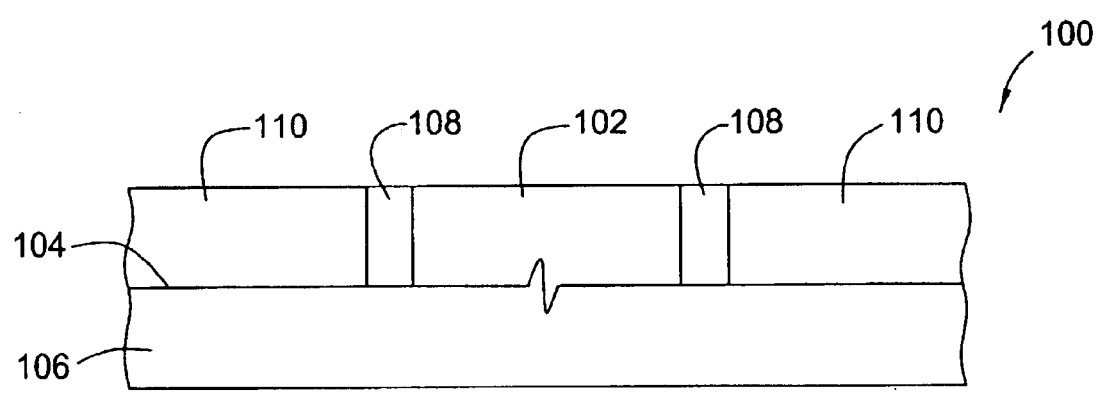
FIG. 1 illustrates a structure formed by the present method.

FIG. 1 illustrates a structure formed by the methods described in detail below. The structure 100 includes a copper interconnect 102 formed on the surface 104 of a substrate 106. The copper interconnect 102 is surrounded by a barrier layer 108 deposited according to the processes described herein. A dielectric layer 110 further surrounds the barrier layer 108.

Figure 2A:
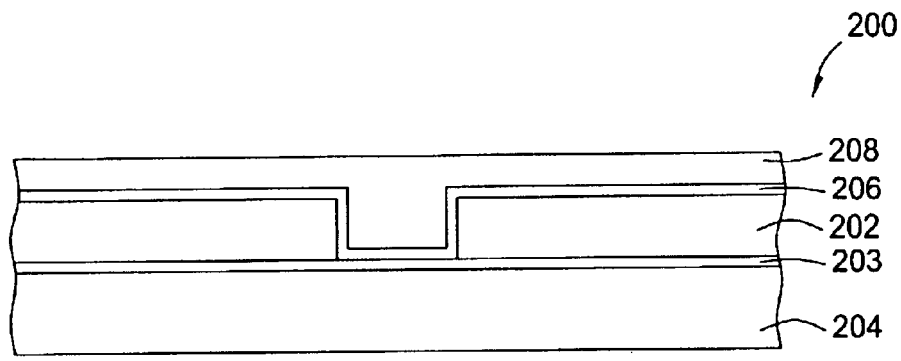
FIGS. 2A–2D illustrate schematic representations of an exemplary interconnect structure at varying stages of fabrication.

FIGS. 2A–2D illustrate the fabrication of an exemplary embodiment of the present invention. FIG. 2A illustrates the first step of depositing a sacrificial layer 202 (an interlevel dielectric) on the substrate or previously deposited dielectric layer 204. The sacrificial layer 202 is generally formed of a material capable of withstanding patterning, etching, and subsequent removal upon copper interconnect formation, such as a low k dielectric film, a spin-on glass, or an oxide. The sacrificial layer 202 may also be formed of a metal other than the metal to be subsequently used as a metal interconnect. Alternatively, the sacrificial layer may consist of a photoresist material. The sacrificial layer 202 can be formed by methods known to one skilled in the art. For example, the sacrificial layer 202 can be formed by chemical vapor deposition (CVD), physical vapor deposition (PVD), electroplating, spin-on plating or atomic layer deposition (ALD). Upon deposition, the sacrificial layer 202 is patterned and etched to form vias and interconnects by techniques known to those skilled in the art, such as processes utilized in dual or single damascene processes.

Additionally, a thin conductive layer 203 may be deposited prior to the deposition of the sacrificial layer 202. The thin conductive layer may have a thickness of from about 10 Å to about 1500 Å. The thin conductive layer can include any material capable of removal, while preventing the removal of the subsequently deposited interconnect material, such as aluminum, tantalum, tungsten and/or titanium. When depositing a thin conductive layer prior to the sacrificial layer 202, the thin conductive layer may be selectively patterned, such as in between vias, in the vias, on the edge of the substrate, or a combination of the above.

Upon via formation, a copper seed layer 206 is deposited to line the interconnect formed in the sacrificial layer 202. The copper seed layer 206 is generally formed of a conductive metal, such as copper or a copper alloy. Copper alloys may include undoped copper deposited utilizing a target comprising undoped copper and a copper alloy comprising aluminum, tin, or zirconium. The copper seed layer may be deposited by methods known in the art, such as physical vapor deposition (PVD), electroless plating, or electrochemical plating. For example, the seed layer may be deposited to a thickness of from about 10 angstroms to about 500 angstroms using high density plasma physical vapor deposition (HDP-PVD) for conformal seed layer coverage. One example of a HDP-PVD chamber is an Ionized Metal Plasma (IMP) Vectra™ chamber, available from Applied Materials, Inc., of Santa Clara, Calif., which may be integrated into an Endura™ platform, available from Applied Materials, Inc. Of course, other techniques, such as physical vapor deposition (PVD), chemical vapor deposition (CVD), electroless plating, and electroplating, may be used.

The IMP chamber includes a target, coil, and biased substrate support member. Typically, a power between about 0.5 kW and about 5 kW is generally applied to the target, and a power between about 0.5 kW and 3 kW is applied to the coil. A power less than about 500 W at a frequency of about 13.56 MHz is generally applied to bias the substrate. The substrate support member is generally heated to a temperature between about 100° C. and 400° C. Argon generally is flowed into the chamber at a rate of about 35 sccm to about 85 sccm, and nitrogen may be added to the chamber at a rate of about 5 sccm to about 100 sccm. The operating pressure of the chamber is typically about 5 mTorr to about 100 mTorr to increase the ionization probability of the sputtered material atoms as the atoms travel through the plasma region.

Preferably, the metal layer is formed using an electroplating cell, such as the Electra™ Cu ECP system, available from Applied Materials, Inc., of Santa Clara, Calif. The Electra™ Cu ECP system may also be integrated into an Endura™ platform also available from Applied Materials, Inc.

Figure 2B:
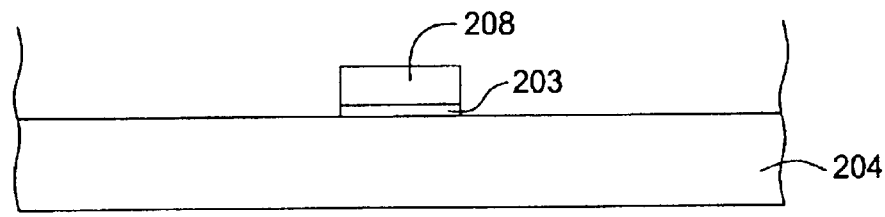

The interconnect generally is then filled by a metal or metal alloy, such as the seed layer material. For example, the interconnect metal can be copper or a copper alloy. Upon filling, the copper fill layer 208 is etched or polished by conventional methods, such as by wet or dry etch processes, or chemical mechanical polishing (CMP) to reveal the underlying sacrificial layer 202 on the field of the layer 204. Once the copper fill layer 208 has been etched, the sacrificial layer 202 is removed to further reveal the copper fill 208 in the interconnect, as shown in FIG. 2B. The sacrificial layer 202 can be removed by methods known to one skilled in the art. For example, the sacrificial layer 202 can be removed by wet or dry etching when the sacrificial layer 202 is formed of a metal and non-conductive material or dry stripping when the sacrificial layer 202 is formed of an organic material.

Alternatively, the copper seed layer 206 and fill layer 208 can be deposited in one processing step, e.g., the seed layer 206 and fill layer 208 may be deposited without interruption and by the same method. Preferably, the seed layer 206 and the fill layer 208 are deposited in an integrated platform configured to deposit both the seed layer 206 and fill layer 208. Optionally, the methods described herein may not include depositing a seed layer. For example, metal alloys formed by spin-on metals and electroless depositions may not require a seed layer 206 for the metal fill to adhere to the sacrificial layer 202.

Figure 2C:
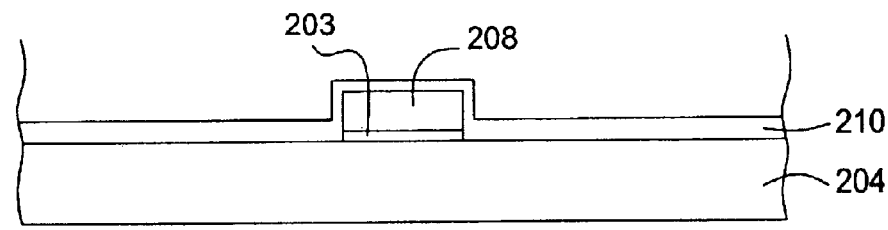

A barrier layer 210 is then deposited upon the copper fill layer 208, as shown in FIG. 2C, to prevent copper migration into subsequently deposited low k dielectric materials. The barrier layer 210 is generally comprised of a material capable of selective removal from the sacrificial layer 202 while minimizing the substantial etching or removing of the interconnect metal. For example, the barrier material may include a refractory metal, such as tungsten, titanium, tantalum, and nitrides thereof, which all have a greater resistivity than copper. The barrier layer 210 further comprises a material having properties such that it will adhere and/or prevent or impede the diffusion of copper atoms into the surrounding low k dielectric layer. Optionally, the barrier layer 210 exhibits insulator properties so as to not short out the metal conductor/interconnect, wherein the barrier layer 210 does not require subsequent etching. The barrier material may further include electroless cobalt or tin that is capable of selectively depositing only on the metal 208 and not on the layer 204. If stray barrier material deposits on layer 204, the barrier material can be removed with wet or dry etch methods. When utilizing electroless deposition techniques, the substrate surface may be precleaned with hydrogen fluoride or another solution capable of removing stray metallic particles from the dielectric. The barrier layers 210 reduce stress migration and electromigration between the copper interconnect 208 and the dielectric layers 212.

In one aspect, the barrier layer 210 is a refractory metal-containing layer, such as tantalum, and includes a refractory metal nitride, such as tantalum nitride. The barrier layer is generally deposited to a thickness of from about 2 Å and about 100 Å by providing one or more pulses of a tantalum-containing compound and one or more pulses of a nitrogen-containing compound to a reaction zone having a substrate disposed therein. Exemplary tantalum-containing compounds include: t-butylimino tris(diethylamino) tantalum (TBTDET); pentakis (ethylmethylamino); tantalum (PEMAT); pentakis (dimethylamino) tantalum (PDMAT); pentakis (diethylamino) tantalum (PDEAT); t-butylimino tris(diethyl methylamino) tantalum(TBTMET); t-butylimino tris(dimethyl amino) tantalum (TBTDMT); bis (cyclopentadienyl) tantalum trihydride ((Cp)$_2$TaH$_3$); bis (methylcyclopentadienyl) tantalum trihydride ((CpMe)$_2$ TaH$_3$); derivatives thereof; and combinations thereof. Exemplary nitrogen-containing compounds include: ammonia; hydrazine; methylhydrazine; dimethylhydrazine; t-butylhydrazine; phenylhydrazine; azoisobutane; ethylazide; derivatives thereof; and combinations thereof.

Each pulse of compound is performed sequentially, and may be accompanied by a continuous flow of a carrier/inert gas. Alternatively, the carrier/inert gas may be pulsed between each pulse of the compounds. This additional flow of gas, whether continuous or pulsed, helps to remove any excess reactants from the reaction zone to prevent unwanted gas phase reactions of the reactive compounds. This additional flow of gas also helps to remove any reaction by-products from the processing chamber, similar to a purge gas. Exemplary carrier/inert gases include argon, helium, hydrogen, nitrogen, and combinations thereof.

The barrier layer 210 may further be annealed to improve adhesion to the interconnect and subsequently deposited dielectric layers. Annealing the barrier layer further improves the stress migration of copper.

Figure 2D:
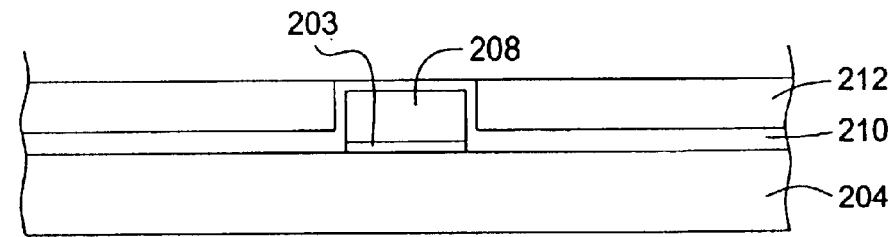

A dielectric layer 212 is then deposited on the barrier layer 210. The dielectric layer 212 generally has a low dielectric constant, e.g., less than about 3.2, and may include extremely low dielectric films (ELK), e.g., films having a dielectric constant of less than about 1.8. Alternatively, the dielectric layer 212 includes a spin-on glass, such as un-doped silicon glass (USG) or fluorine-doped silicon glass (FSG). Alternatively, the dielectric layer may comprise pockets of a vacuum, gas, or air (not shown). The pockets may be selectively etched out of the dielectric layer 212 or areas of the dielectric layer 212 may be selectively treated with electricity to form the pockets. Further, a combination of dielectric layers may be used to provide structural integrity and allow the structure to survive future processing. For example, if air is used, oxide or other dielectric materials having mass and structure may be selectively deposited in key locations to support or separate metal lines for further interconnect or packaging steps. The key locations may be determined based on structural analysis. FIG. 2D illustrates the resulting structure having the dielectric 212 and barrier 210 material. The top portion of the resulting structure, i.e., the barrier 210 and dielectric layers 212, may be etched or planarized to reveal the metal interconnect. A chemical mechanical polishing (CMP) apparatus may be used, such as the MirraRM System, available from Applied Materials, Santa Clara, Calif. Optionally, the intermediate surfaces of the structure may be planarized between the deposition of the subsequent layers as described above. Alternatively, the dielectric layer 212 may be selectively etched to maintain the structural integrity of the material 212. The steps described above may be repeated to form any number of desired copper interconnects, with the number of sacrificial layers 202 generally being equal to the number of metal 208 and dielectric layers 212. The number of sacrificial layers 202 may be less than the number of metal layers 208 depending on the necessity of low dielectric films.

Figure 3A:
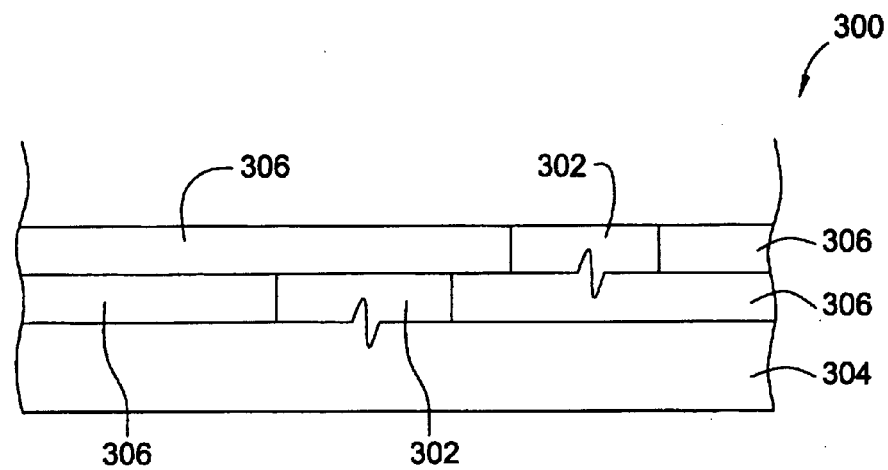
FIGS. 3A–3C illustrate an exemplary interconnect structure at varying stages of fabrication.
Figure 3B:
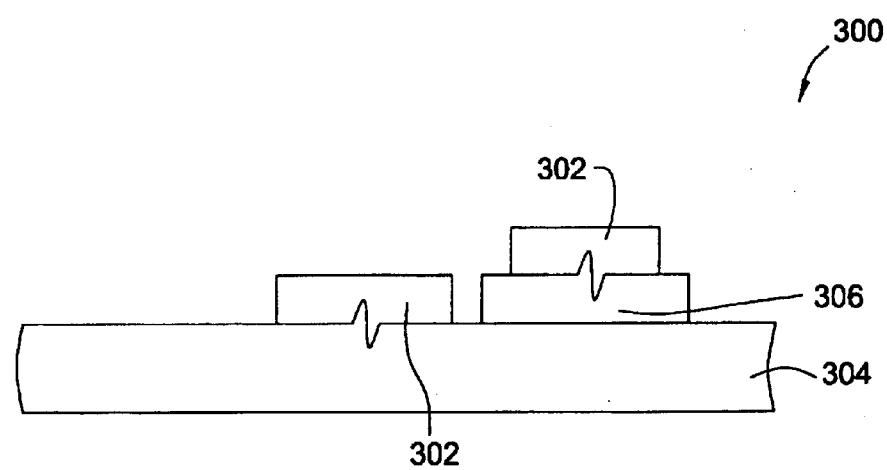
Figure 3C:
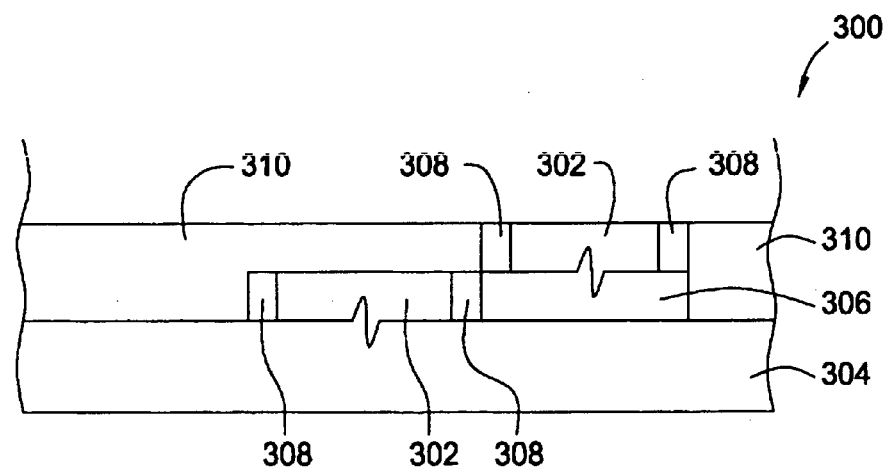

FIGS. 3A–3C illustrate an alternative method of fabricating a structure 300, similar to structure 200. If multiple copper layers 302 are deposited on the substrate 304, the sacrificial layer 306 need not be removed at each metal layer 302, but may be removed after a number of metal interconnects have been formed, as illustrated in FIGS. 3A–3B. Upon removal of the sacrificial layer 306, the barrier layer 308 and dielectric layer 310 are then deposited, as shown in FIG. 3C.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
   forming a copper interconnect in a sacrificial layer deposited on the substrate by patterning the sacrificial layer to form an interconnect and filling the interconnect with copper;
   removing at least a portion of the sacrificial layer upon formation of the copper interconnect;
   depositing a barrier layer on the copper interconnect; and
   forming a dielectric layer on the substrate after depositing the barrier layer to insulate the copper interconnect.

2. The method of claim 1, wherein the sacrificial layer comprises a material configured to withstand patterning, etching, and removal without altering the copper interconnect.

3. The method of claim 1, wherein the sacrificial layer comprises a material selected from the group consisting essentially of a low dielectric material, a spin-on glass, a photoresist material, an oxide and combinations thereof.

4. The method of claim 1, further comprising depositing a conductive layer on the substrate prior to the sacrificial layer.

5. The method of claim 1, further comprising depositing a conductive layer having a thickness of from about 10 Å to about 1500 Å prior to the deposition of the sacrificial layer.

6. The method of claim 1, further comprising depositing a copper seed layer to line the interconnect prior to filling the interconnect with copper.

7. The method of claim 6, further comprising depositing the copper seed layer and the copper fill in the same chamber.

8. The method of claim 1, wherein the barrier layer prevents copper migration into subsequently deposited dielectric layers.

9. The method of claim 1, wherein the barrier layer comprises a refractory metal.

10. The method of claim 9, wherein the barrier layer comprises tantalum nitride.

11. The method of claim 1, wherein the barrier layer comprises a material capable of selective removal from underlying layers and having a greater resistivity than copper.

12. The method of claim 1, wherein the barrier layer is deposited by electroless metal deposition.

13. The method of claim 12, further comprising precleaning the substrate surface with hydrogen fluoride.

14. The method of claim 1, further comprising annealing the barrier layer to improve adhesion to the copper interconnect.

15. The method of claim 1, wherein the dielectric layer comprises a dielectric material having a dielectric constant of less than about 3.0.

16. The method of claim 1, wherein the dielectric layer comprises a dielectric material having a dielectric constant of less than about 1.8.

17. The method of claim 1, wherein the dielectric layer comprises a spin-on glass.

18. The method of claim 1, wherein the dielectric layer comprises pockets of a material selected from the group consisting essentially of a vacuum, air, a gas, or combinations thereof.

19. The method of claim 1, further comprising chemical mechanical polishing the dielectric layer to reveal the underlying copper interconnect.

20. A method for processing a substrate, comprising:
   a) forming a first copper interconnect in a first sacrificial layer deposited on the substrate by patterning the first sacrificial layer to form a first interconnect and filling the first interconnect with copper;
   b) forming a second copper interconnect in a second sacrificial layer deposited on the substrate by patterning the second sacrificial layer to form a second interconnect and filling the second interconnect with copper;
   c) removing at least a portion of the first and second sacrificial layers;
   d) depositing a barrier layer adjacent the first and second copper interconnects; and
   e) depositing a dielectric layer adjacent the barrier layer.

21. A method for processing a substrate, comprising:
   depositing a conductive layer on the substrate;
   depositing a sacrificial layer on the conductive layer;
   patterning the sacrificial layer to form an interconnect;
   depositing a copper seed layer to line the interconnect;
   filling the interconnect with copper to form a copper interconnect;
   removing the sacrificial layer upon copper interconnect formation;
   depositing a barrier layer on the copper interconnect; and
   depositing a dielectric layer on the barrier layer.

* * * * *